US005449435A

United States Patent [19]

Ageno et al.

[11] Patent Number: 5,449,435

[45] Date of Patent: Sep. 12, 1995

[54] FIELD EMISSION DEVICE AND METHOD OF MAKING THE SAME

[75] Inventors: Scott K. Ageno; Robert C. Kane, both of Scottsdale, Ariz.

[73] Assignee: Motorola, Schaumburg, Ill.

[21] Appl. No.: 970,736

[22] Filed: Nov. 2, 1992

[51] Int. Cl.[6] .......................... H01L 21/00; H01J 1/02; B44C 1/22

[52] U.S. Cl. .............................. 156/657.1; 156/662.1; 156/643.1; 313/309

[58] Field of Search ........................ 156/657, 662, 643; 313/309; 437/228

[56] References Cited

U.S. PATENT DOCUMENTS 3,970,887 7/1976 Smith et al. .......................... 313/309
4,168,213 9/1979 Hoeberechts .................... 156/659.1
4,964,946 10/1990 Gray et al. .......................... 156/657
4,968,382 11/1990 Jacobson et al. .................. 156/657
5,064,396 11/1991 Spindt ................................. 445/50
5,100,355 3/1992 Marcus et al. ...................... 156/628
5,201,992 4/1993 Marcus et al. ...................... 156/651

*Primary Examiner*—Brian E. Hearn
*Assistant Examiner*—Laura M. Holtzman
*Attorney, Agent, or Firm*—Gary F. Witting

[57] ABSTRACT

A method for forming a field emission device. A substrate is selectively patterned. An etch is performed to remove portions of the substrate to form protrusions. An oxidation is performed to the substrate that forms a first oxidized layer. A perpendicular etch is performed that removes portions of the first oxidized layer. A second oxidation is performed to the substrate that forms a second oxidized layer. A conductive or semiconductive layer is deposited onto the second oxidized layer. An etch is performed to remove a portion of the first oxidized layer and a portion of the second oxidized layer to expose the protuberance.

22 Claims, 7 Drawing Sheets

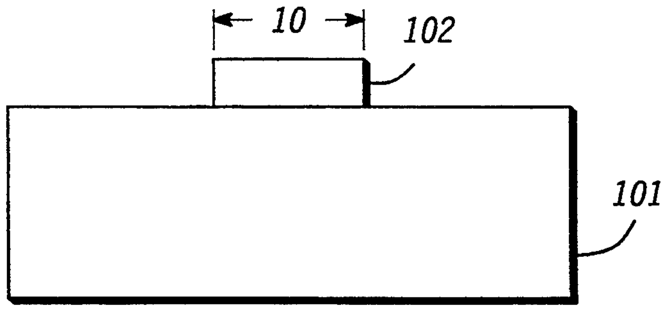
FIG. 1
FIG. 2
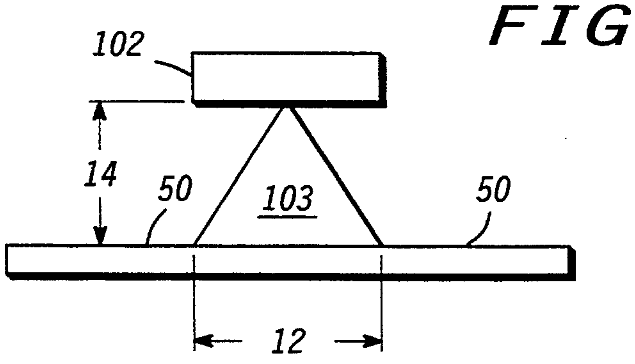
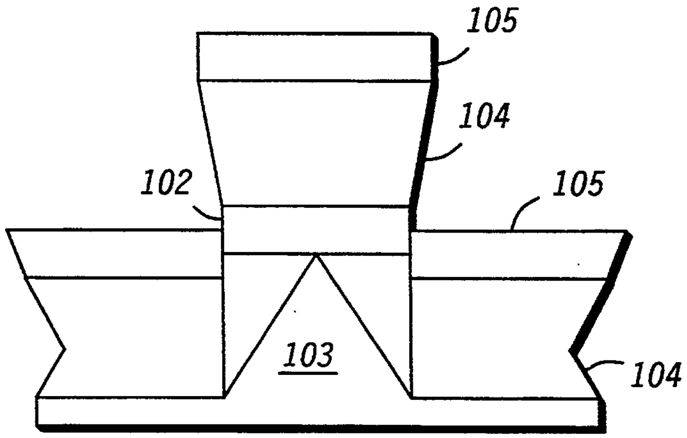
FIG. 3

FIG. 4
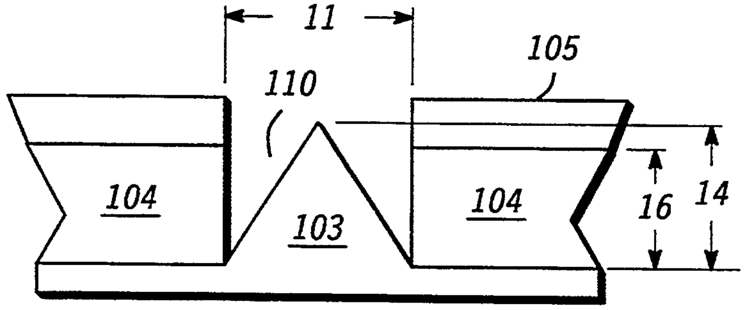
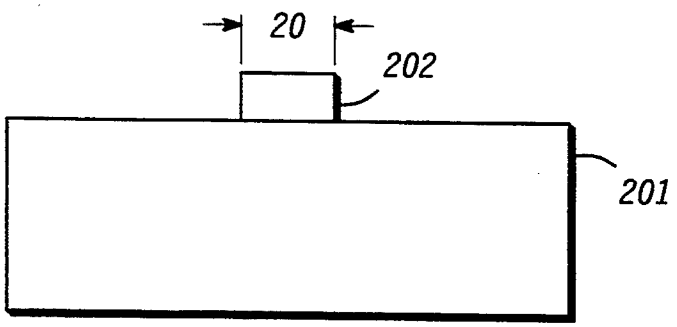
FIG. 5
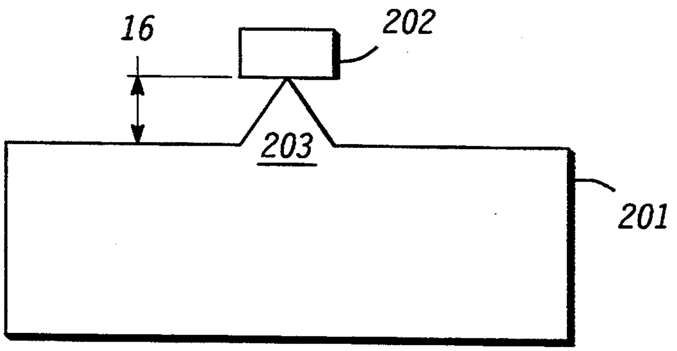
FIG. 6

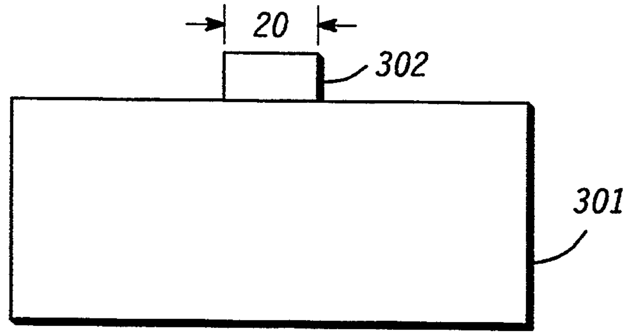
FIG. 12
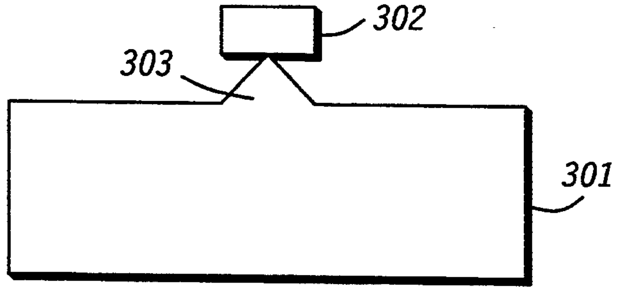
FIG. 13
FIG. 14
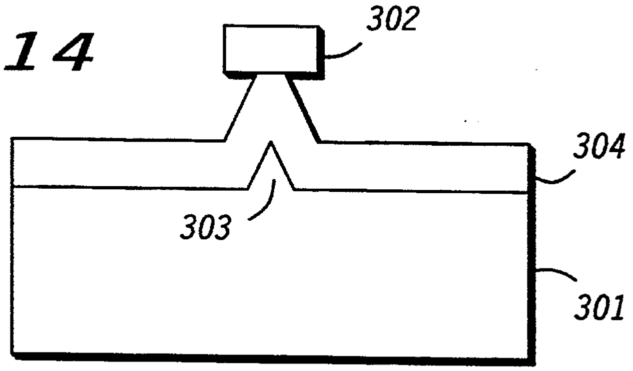

FIELD EMISSION DEVICE AND METHOD OF MAKING THE SAME

BACKGROUND OF THE INVENTION

This invention relates, in general, to fabrication of field emission devices, and more particularly, to fabrication of field emission devices employing semiconductor material.

Field emission devices (FEDs) are known in the art. Commonly, FEDs include an electron emitter that has at least one geometric discontinuity of a small radius of curvature such as a sharp tip or sharp edge and an extraction electrode that is proximally disposed with respect to the electron emitter so that upon application of a suitable potential between the extraction electrode and the electron emitter electrons are emitted into a free-space region.

Several, methods for realizing physical embodiments of FEDs are also known. A first method employs directional evaporation of conductive materials into a cavity to form an electron emitting cone. A second method employs a wet selective anisotropic etch that etches a crystalline material to provide an electron emitter having a desired geometric discontinuity of small radius of curvature. A third method employs anisotropic etching to provide features that are employed as molds into which material is deposited to subsequently function as an electron emitter.

In the prior art, corresponding to the first method, fabrication complexities associated with the material evaporation impose manufacturing constraints.

The second method previously mentioned suffers from performance limitations associated with known fabrication techniques.

The third method previously mentioned suffers from fabrication complexity, difficulties in manufacture, and lack of ruggedness.

In addition, the prior art methods that employ crystalline material substrates having an electron emitter formed therefrom typically are not capable of having an adequate insulating layer height to a cavity aperture diameter ratio of greater than approximately 0.75.

Accordingly, there exists a need for a method of forming field emission devices which overcome at least some of the shortcomings of the prior art.

SUMMARY OF THE INVENTION

This need and others are at least partially satisfied by providing a method for forming a field emission device including the steps of providing a substrate comprised of suitable material having at least a major surface, depositing and selectively patterning a photomask onto the major surface, performing a substantially anisotropic material etch to selectively remove some material from the substrate, performing a first oxidation of some of the material, performing a substantially perpendicular (normal) etch to remove some of the oxidized material, performing a second oxidation of some of the remaining material, depositing a conductive or a semiconductive material onto the oxidized material, and performing an etch to remove some of the oxidized material.

In some embodiments of field emission devices realized by performing steps in accordance with a method of the present invention, an aspect ratio (electron emitter height to cavity aperture diameter) greater than approximately 1.0 is provided.

In some embodiments of field emission devices realized by performing steps in accordance with a method of the present invention, a reduced capacitance field emission device is provided.

BRIEF DESCRIPTION OF THE DRAWINGS

FIGS. 1–4 are cross-sectional illustrations of structures realized by performing various steps of a method of forming a field emission device;

FIGS. 5–11 are cross-sectional illustrations of structures realized by performing various steps of a method for forming a field emission device in accordance with the present invention; and FIGS. 12–18 are cross-sectional illustrations of structures realized by performing various steps of another method for forming a field emission device in accordance with the present invention.

DETAILED DESCRIPTION OF THE DRAWINGS

Figure 7:
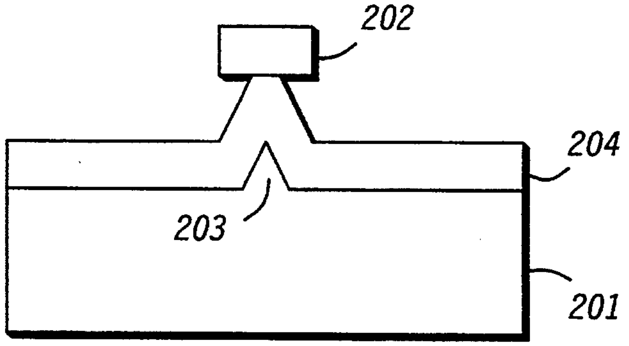

FIGS. 1–4 are cross-sectional illustrations of structures realized by performing various steps of methods for fabricating field emission devices.

FIG. 1 depicts a cross-sectional illustration of a substrate 101 having a major surface on which is disposed a selectively patterned photomask 102 having associated therewith a diameter 10.

FIG. 2 is a cross-sectional illustration of the structure of FIG. 1 that has undergone a wet chemical anisotropic etch step that provides a protuberance 103 which protrudes from substrate 101 and that has a height 14. A basal area cross-sectional diameter 12 is associated therewith. Height 14 of protuberance 103 correspond to a normal or perpendicular extent of protuberance 103 with respect to an etched surface 50 of substrate 101 to an apex or a tip of protuberance 103. Diameter 12 corresponds approximately to a maximal cross section of basal area of protuberance 103.

Wet chemical anisotropic etching is known and typically performed with semiconductor substrates including, for example, silicon, germanium, or diamond (carbon) to provide protuberances which function as electron emitters, for emitting electrons. In such applications, it is desirable to provide a substrate that is selectively doped with an impurity that allows an acceptable conductivity level in the substrate. Wet chemical anisotropic etching generally is performed with a preferred crystallographic orientation of the substrate partially exposed, such as a 100 crystallographic orientation, as the major surface. Since the anisotropic etch proceeds in a preferred direction more quickly than in other directions, protuberance 103 that resembles a cone structure or a pyramid structure as depicted in cross-sectional illustrations in FIGS. 1–4 is realized.

FIG. 3 is a cross-sectional illustration of the structure of FIG. 2 that has undergone additional steps including deposition of an insulative layer 104 onto etched surface 50 of substrate 101 and, subsequently, deposition of a conductive or a semiconductive material 105 onto insulative layer 104. It should be understood that material 105 is capable of being made of either a conductive material such as any number of metals, e.g., aluminum, titanium, metal alloys, or the like, or a semiconductor material, e.g., arsenic doped polysilicon, phosphorus doped polysilicon or the like. It should be noted that as a result of etching substrate 101, and with reference to the drawing FIGURES, that location of the major surface with respect to the bulk material of the substrate may vary. That is, as material etching of substrate 101 takes place, the major surface may be removed to expose underlying material in which instance the newly exposed previously underlying material henceforth defines the major surface.

FIG. 4 is a cross-sectional illustration of the structure described previously with reference to FIG. 3 and that has undergone an additional step of selective lift-off. The selective liftoff step removes remaining photomask 102 from substrate 101 and exposes protuberance 103 that functions in an operable device as an electron emitter. FIG. 4 illustrates that aperture diameter 11, of a cavity 110 that has been realized by performing the steps of the method as described above is substantially the same as diameter 10 of patterned photomask 102. FIG. 4 also illustrates that thickness 16 is substantially similar to a thickness of insulative material 104.

The method described with reference to FIGS. 1–4 provides for realization of a field emission device where protuberance 103, desirably performs as an electron emitter and conductive or semiconductive material 105 functions as an extraction electrode. In the presence of an externally provided signal source operably coupled between the electron emitter and the extraction electrode, electrons are emitted by the electron emitter It should be observed that by employing the method described above in fabricating a field emission device (FED) that a number of restrictions in device geometry are imposed. First, a diameter of cavity 110 is substantially determined by diameter 10 of patterned photomask 102. The diameter of patterned photomask 102 also determines an extent to which the anisotropic etch may be carried which relates to an overall height of the structure. Referring once again to FIG. 2 it will be observed that if photomask 102 material is to remain in place, as required by the method steps, the anisotropic etch must be terminated when at least some substrate 101 material remains on which photomask 102 is disposed. This provides for a maximum protuberance height 14. This imposes a relationship, subject to an angle formed by the anisotropy of the etch (approximately 57 degrees for diamond crystal structures such as silicon, germanium, and carbon and zincblende structures such as gallium arsenide).

$$T1 = \frac{D1\tan(\phi)}{2}$$

By way of example, using patterned photomask 102 having diameter 10, D1, being 1.0 μm, height 14, T1, is restricted to less than approximately 0.75 μm. Further, it is common to provide an extraction electrode of conductive or semiconductive material 105 with a thickness on the order of 0.4 μm which is desirably centered with respect to a plane formed parallel to the major surface and tangent to the upper extent of protuberance 103. In order to realize a structure exhibiting such features, it is necessary to limit the thickness of deposited insulative material 104 to a thickness 16, as illustrated in FIG. 4, that is less than protuberance height 14.

FIGS. 5–11 are cross-sectional illustrations of structures which are realized by performing various steps of a method for forming a field emission device in accordance with the present invention. FIG. 5 depicts a substrate 201 having a major surface on which is deposited and patterned a mask layer 202. The features formed by selective patterning of mask layer 202 exhibit a preferred cross-sectional diameter such as that illustrated in FIG. 5 as diameter 20. Mask layer 202 is capable of being fabricated by several different methods, such as photolithography or a combination of deposition, photolithography, and etching processes to produce a hard mask such as an aluminum mask, a gold mask, an aluminum nitride mask, a silicon nitride mask. By selecting a preferred masking material, a greater latitude of processing parameters is capable of being realized.

FIG. 6 is a cross-sectional illustration of the structure of FIG. 5 that has undergone an additional step of the method which is an etch step such as a wet anisotropic etch to selectively removed some of material of substrate 201 to provide protuberance 203 having height 16, and as described previously with reference to FIG. 2. FIG. 7 is a cross-sectional illustration of the structure of FIG. 6 that has undergone an additional step of the method which is a first oxidation step wherein some of the material which comprises both substrate 201 and protuberance 203 is oxidized to provide a first oxidized layer 204 and to form, as part of protuberance 203, a geometric discontinuity of small radius of curvature of approximately 500 angstroms or less which is depicted as an apex of conical (in cross sectional view) structure which includes protuberance 203.

Figure 8:
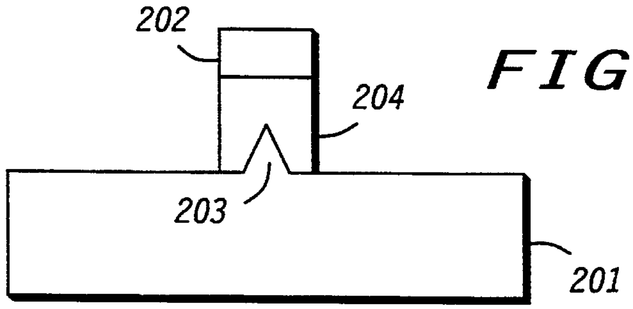

FIG. 8 is a cross-sectional illustration of the structure of FIG. 7 that has undergone an additional step of the method which is a directional anisotropic etch step such as a reactive ion etch to remove some of oxidized layer 204.

Figure 9:
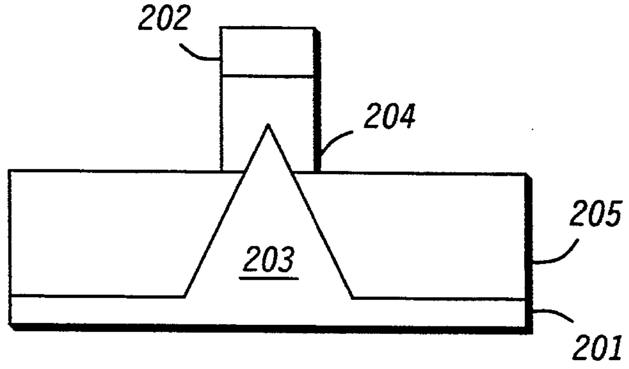

FIG. 9 is a cross-sectional illustration of the structure of FIG. 8 that has undergone an additional step of the method which is a second oxidation step wherein some of the material which includes both substrate 201 and protuberance 203 is oxidized to provide a second oxidized layer 205. In so doing, protuberance 203 exhibits a basal area having a diameter corresponding to a maximal cross-sectional extent with reference to the major surface of substrate 201.

Figure 10:
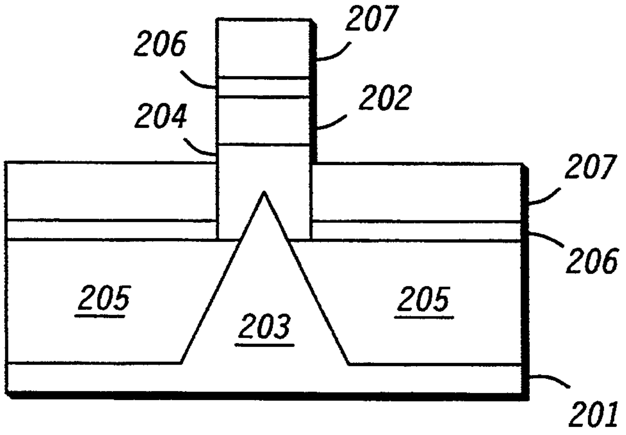
Figure 11:
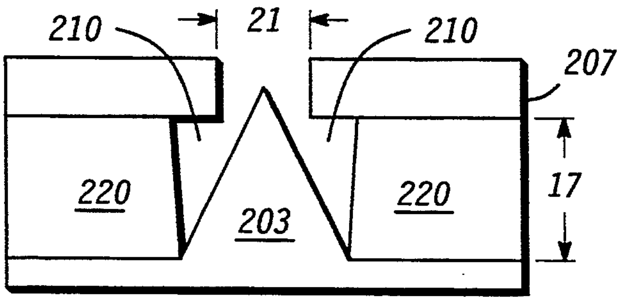

FIG. 10 is a cross-sectional illustration of the structure of FIG. 9 that has undergone additional steps of the method including steps of depositing an insulative layer 206 onto second oxidized layer 205 and depositing a conductive or semiconductive material 207 onto insulative layer 206. It should be understood that material 207 is capable of being made of either a conductive material such as any number of metals, e.g., aluminum, titanium, metal alloys, or the like, or a semiconductor material, e.g., arsenic doped polysilicon, phosphorus doped polysilicon or the like. Alternatively, while it may be desired not to deposit the insulative layer 206 at times, it should be realized that deposition of insulative layer 206 enables an adjustment capability of height 17, as shown in FIG. 11, of conductive or semiconductive material 207. Thus, by optimizing placement of conductive or semiconductive material 207 with reference to height 17, as shown in FIG. 11, performance of the FED is enhanced.

In addition, depending upon structure of masking layer 202, a space between conductive or semiconductive material 207 and masking layer 202 is advantageous to expose oxidized layer 204 so as to facilitate removal of oxidized layer 204.

FIG. 11 is a cross-sectional illustration of the structure of FIG. 10 that has undergone additional steps of the method including removing all of mask 202 including any material disposed thereon, removing all remaining first oxidized layer 204, removing some of insulator layer 206 and some of second oxidized layer 205 by chemical or isotropic etching. Further, it should be understood that remaining second oxidized layer 205 and remaining insulative layer 206 are referenced in FIG. 11 as a single insulating layer 220.

By way of example, with substrate 201 being silicon and mask layer 202 being a photomask, the silicon substrate is divided by the photomask into exposed portions and unexposed or cover portions. Typically, etching of photomasked substrate 201 is achieved in an aqueous wet anisotropic etch solution of potassium hydroxide with a temperature range between 22.0 degrees Celsius and 35.0 degrees Celsius. However, it should be understood by one of ordinary skill in the art that protuberance 203 is also capable of being fabricated by a dry plasma chemical etch with the plasma having a base chemistry of fluorine.

Upon completion of the previously described etch step, substrate 201 is oxidized to form a oxidized layer 205 that in this example is a silicon dioxide. The silicon dioxide is formed by any number of oxidation methods, such as HIPOX, atmospheric oxidation, steam oxidation, or the like.

Substrate 201 is then directionally etched to remove at least a portion of the oxidized layer 205 from about mask layer 202 by any number of methods, such as reactive ion etch (RIE) or ion milling. In a preferred method in this particular example, RIE is used to etch the silicon dioxide with a low pressure plasma ranging between 10 millitorr to 100 millitorr and a base plasma chemistry that includes fluorine.

Substrate 201 is then oxidized again to form a second oxidized layer 205 by the methods previously described above.

Conductive or semiconductive material 207 is subsequently deposited on second oxidized layer 205 by any number of methods depending upon material selection used for conductive or semiconductive material 207 deposition. That is, materials such as metals and metal alloys typically are deposited by sputtering or evaporation, whereas polysilicon and polysilicides are typically deposited by Low Pressure Chemical Vapor Deposition (LPCVD) or Plasma Enhanced Chemical Vapor Deposition which is subsequently doped with several different materials, such as arsenic, phosphorus, tungsten, platinum, or the like.

Upon completion of deposition of conductive or semiconductive material 207, substrate 201 is etched in an acid solution of Hydrofluoric Acid (HF) that etches away silicon dioxide of oxidized layer 204, thus lifting-off photomask 202 and conductive or semiconductive layer 207 on photomask layer 202 and exposing protuberance 203. Additionally, the HF also etches away portions of silicon dioxide of oxidized layer 205, thereby forming cavities 210.

It will be immediately appreciated that by performing steps of the method of the present invention, a field emission device is realized having a cavity aperture diameter 21, as illustrated in FIG. 11, associated with a cavity 210 in which protuberance 203 is substantially disposed that is independent of thickness 17 of insulating layer 220. Referring once again to FIGS. 5–11 it is observed that height 17 of protuberance 203 and insulating layer 220 is related to an extent of the anisotropic etches and oxidation steps and not to diameter 20 of mask 202 feature.

Since the performance of FEDs is, in some applications, related to a capacitance that arises between extraction electrode (including the conductive or semiconductive layer 207), the electron emitter (protuberance e.g., protuberance 203), and associated conductive lines (not shown), it will be appreciated that by increasing an interelectrode spacing, i.e., a distance between the extraction electrode and the associative conductive lines (not shown), capacitive effects will be inversely effected, thus reducing capacitive effect and enhancing performance of the FED fabricated with the present invention.

Referring now to FIGS. 12–14, there are cross-sectional illustrations of structures realized by performing various steps of another method for forming a field emission device in accordance with the present invention.

FIGS. 12–18 are cross-sectional illustrations of structures realized by performing steps of the present method and as described previously with reference to FIGS. 5–7 and wherein the features previously described are similarly referenced beginning with the numeral "3".

Figure 15:
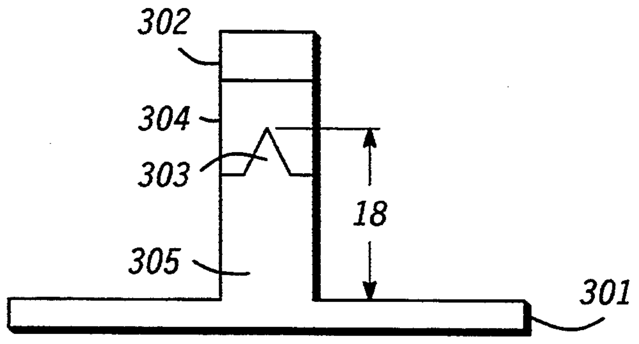

FIG. 15 is a cross-sectional illustration of the structure described previously with reference to FIG. 14 that has undergone an additional step of the method of the present invention which is an anisotropic etch step, such as a reactive ion etch process, to remove some of first oxidized layer 304 and some of substrate 301 such that a substantially columnar protrusion 305 is formed on which protuberance 303 is disposed. By way of example, with substrate 301 being silicon and first oxidized layer 304 being a silicon dioxide, the silicon dioxide is reactive ion etched by using the method previously described. The silicon of substrate 301 typically is reactive ion etched using low pressure ranging between 10 millitorr to 50 millitorr and a base chemistry that includes chlorine. A height 18 defines an aggregate extent of protrusion 305 and protuberance 303 that is normal to the major surface.

Figure 16:
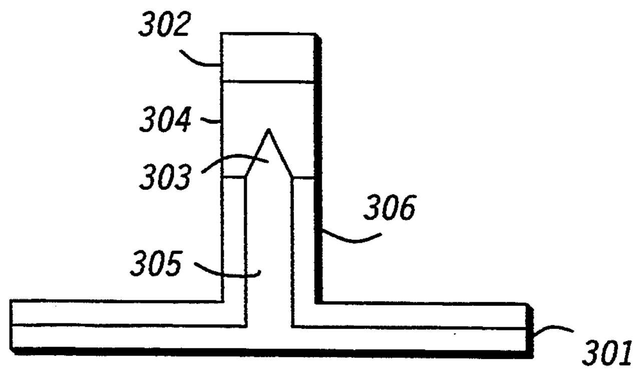

FIG. 16 is a cross-sectional illustration of the structure of FIG. 15 that has undergone an additional step of the method of the present invention which is a second oxidation step which oxidizes some material which includes substrate 301, protrusion, 305, and protuberance 303 to provide a second oxidized layer 306.

Figure 17:
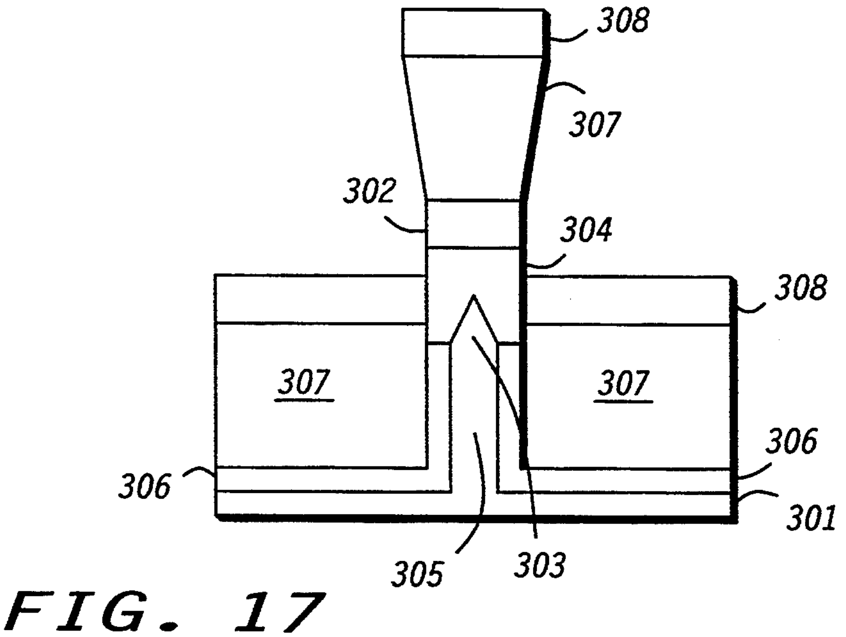

FIG. 17 is a cross-sectional illustration of the structure described previously with reference to FIG. 16 that has undergone additional steps of the method of the present invention. These steps include depositing an insulative layer 307 onto second oxidized layer 306 and subsequently depositing a conductive or semiconductive layer 308 onto insulative layer 307.

Figure 18:
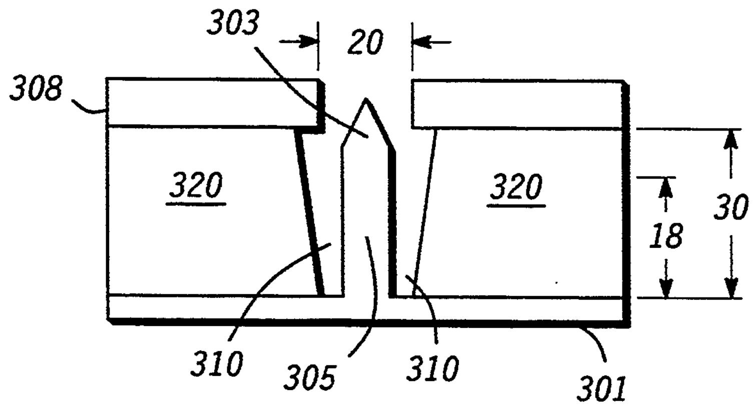

FIG. 18 is a cross-sectional illustration of the structure described previously with reference to FIG. 17 and having undergone additional steps of the method of the present invention including the steps of removing substantially all of the remaining mask 302, removing substantially all of the first oxidized layer 304, and removing some of insulative layer 307 and some of second oxidized layer 306. FIG. 18 further illustrates that the remaining second oxidized layer 306 and insulative layer 307 (both described previously) are included in insulating layer 320.

It should be observed that by performing the steps of the method of the present invention as described with reference to FIGS. 12–18 that restrictions on feature size with respect to protuberance height and cross sectional extent of the basal area (diameter) of the protuberance or cavity aperture diameter are further relieved. The structure of FIG. 18 illustrates that by performing the anisotropic etches and oxidations as described with reference to FIGS. 14–16 the electron emitter, including protuberance 303 disposed on protrusion 305 and further disposed in cavity 310, is not restricted in height as a function of cavity aperture diameter 20. Insulating layer 320 of the structure depicted in FIG. 18 illustrates a thickness 30, which is greater than previously described thickness 18 that represents a nominal insulating layer thickness realized by other methods. In addition, it should be realized that the method described with references to FIGS. 12–18 further removes the previously described restrictions and allows for the aperture diameter ratio to exceed 10.0. Correspondingly, the methods of the present invention provide for a field emission device that exhibits a reduced capacitance in the FEDs.

Since field emission devices formed by methods of the present invention provide for independence between aperture diameter and insulating layer thickness, it is also a feature of the disclosed methods of the present invention that field emission devices are capable of operating at lower extraction voltages (voltage applied between the extraction electrode and the electron emitter) as a result of a reduced aperture diameter for a given insulating layer thickness.

Further, by employing the methods of the preset invention, the insulating layer height to cavity aperture diameter ratio is capable of achieving ration of greater than approximately 1.0.

We claim:

1. A method for forming a field emission device comprising the steps of:

A providing a substrate having at least a major surface;

B depositing and selectively patterning a mask onto the major surface of the substrate, thereby exposing a portion of the substrate and covering another portion of the substrate with the mask;

C performing an etch of the masked substrate to selectively remove a portion of the substrate surrounding and under the mask, thereby forming an etched substrate having a protuberance with an apex on the major surface of the substrate under the mask;

D performing a first oxidation of the etched substrate to form a first oxidation layer, wherein the first oxidation layer extends beneath the mask such that a portion of the first oxidation layer is exposed and another portion of the first oxidation layer is covered by the mask;

E performing a perpendicular etch to selectively remove the exposed portion of the first oxidized layer from about the mask, thereby leaving the another covered portion of the first oxidized layer under the mask;

F performing a second oxidation of the substrate subsequent to the perpendicular etch, thereby forming a second oxidation layer on the substrate;

G depositing a layer of material including one of a conductive and semiconductive material onto the second oxidized layer, thereby forming a conductive layer substantially in a plane with the apex of the protuberance; and H performing an etch, subsequent to depositing the layer of material, to remove portions of the first oxidized layer and portions of the second oxidized layer, thereby exposing at least the apex of the protuberance.

2. A method for forming a field emission device as claimed in claimed 1 wherein the step of depositing the layer of material includes depositing a doped polysilicon.

3. A method for forming a field emission device as claimed in claimed 1 wherein the substrate is selected from a group of suitable materials consisting of silicon, diamond, germanium, and gallium arsenide.

4. A method for forming a field emission device as claimed in claimed 1 wherein the performing of the etch of the substrate is achieved by a wet anisotropic etch.

5. A method for forming a field emission device as claimed in claimed 1 wherein the step of depositing the layer of material includes depositing an aluminum.

6. A method for forming a field emission device as claimed in claimed 1 wherein the performing of a perpendicular etch is achieved by a reactive ion etch.

7. A method for forming a field emission device as claimed in claimed 1 wherein the performing of a perpendicular etch is achieved by ion milling.

8. The method for forming a field emission device as claimed in claimed 1 wherein depositing and selectively pattering the mask onto the major surface is achieved with a photomask.

9. A method for forming a field emission device as claimed in claimed 1 wherein the depositing and selectively pattering the mask onto the major surface is achieved with a hardmask.

10. A method for forming a field emission device comprising the steps of:

A providing a semiconductor substrate having at least a major surface;

B depositing and selectively patterning a mask onto the major surface of the semiconductor substrate, thereby exposing portions of the semiconductor substrate and covering other portions of the semiconductor substrate;

C performing a wet anisotropic material etch on the semiconductor substrate that removes the semiconductor substrate in the exposed portions and removes the semiconductor substrate under the mask to form a protuberance;

D performing a first oxidation of the masked and etched semiconductor substrate, thereby forming a first oxidization layer on the semiconductor substrate;

E performing a perpendicular etch to remove the first oxidation of the semiconductor substrate from about the mask, thereby exposing the semiconductor substrate;

F performing a second oxidation of the semiconductor substrate subsequent to the perpendicular etch, thereby forming a second oxidation layer on the semiconductor substrate;

G depositing an insulator layer onto the second oxidation layer;

H depositing a layer of material including one of a conductive and semiconductive material onto the insulator layer, thereby placing a conductive layer substantially in a plane with the protuberance; and I performing an etch to remove some of the oxidized material subsequent to depositing the layer of material, thereby exposing at least the protuberance formed of the semiconductor substrate.

11. A method for forming a field emission device as claimed in claimed 10 wherein the step of depositing the layer of material includes depositing a doped polysilicon.

12. A method for forming a field emission device as claimed in claimed 10 wherein the semiconductor substrate is selected from a group of suitable materials consisting of silicon, diamond, germanium, gallium arsenide.

13. A method for forming a field emission device as claimed in claimed 10 wherein the step of depositing the layer of material includes depositing an aluminum.

14. A method for forming a field emission device as claimed in claimed 10 wherein the performing of a perpendicular etch is achieved by reactive ion etch.

15. A method for forming a field emission device as claimed in claimed 10 wherein the performing of a perpendicular etch is achieved by ion milling.

16. A method for forming a field emission device comprising the steps of:

A providing a substrate of a suitable material having a major surface;

B depositing and selectively patterning a photomask onto the major surface to provide a masked substrate;

C performing a anisotropic material etch on the masked substrate to selectively remove some material from the etched substrate, thereby forming a protuberance under the mask;

D performing a first oxidation of the etched substrate, thereby forming a first oxidation layer;

E performing a normal etch to remove at least a portion of first oxidation layer;

F performing a second oxidation of the substrate subsequent to performing the normal etch, thereby forming a second oxidation layer;

G depositing insulating material onto the second oxidation layer;

H depositing a layer of material including one of a conductive and semiconductive material onto the insulating material;

I performing an etch, subsequent to depositing the layer of material, to remove some of the first oxidized layer and some of the insulating material, thereby exposing at least the protuberance formed of the substrate.

17. A method for forming a field emission device as claimed in claimed 16 wherein the step of depositing the layer of material includes depositing a doped polysilicon.

18. A method for forming a field emission device as claimed in claimed 16 wherein the substrate is selected from a group of suitable materials consisting of silicon, diamond, germanium, gallium arsenide.

19. A method for forming a field emission device as claimed in claimed 16 wherein the etching of the semiconductor material is achieved by a wet anisotropic etch.

20. A method for forming a field emission device as claimed in claimed 16 wherein the step of depositing the layer of material includes depositing an aluminum.

21. A method for forming a field emission device as claimed in claimed 16 wherein the performing of a perpendicular etch is achieved by reactive ion etch.

22. A method for forming a field emission device as claimed in claimed 16 wherein the performing of a perpendicular etch is achieved by ion milling.

* * * * *